(12) United States Patent
Staufer et al.

(10) Patent No.: US 6,606,025 B1
(45) Date of Patent: Aug. 12, 2003

(54) SYNCHRONOUS DEMODULATOR

(75) Inventors: Hans Staufer, Le vaud Surla Croix (CH); Anthony Newton, Le Vaud (CH)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/319,230

(22) PCT Filed: Sep. 28, 1998

(86) PCT No.: PCT/EP98/06187

§ 371 (c)(1),
(2), (4) Date: Oct. 1, 1999

(87) PCT Pub. No.: WO99/18659

PCT Pub. Date: Apr. 15, 1999

(30) Foreign Application Priority Data

Oct. 3, 1997 (GB) .............................................. 9721055

(51) Int. Cl.⁷ ................................................ H04Q 5/22
(52) U.S. Cl. .................. 340/10.4; 340/10.1; 340/10.33; 340/10.34; 340/10.4; 340/10.41; 340/825.69; 340/825.72; 455/19
(58) Field of Search ............................. 340/10.4, 10.1, 340/10.3, 572.1, 10.33, 10.34, 10.41, 825.69, 825.72, 825.71; 455/19, 21; 235/380

(56) References Cited

U.S. PATENT DOCUMENTS

| | | | | |
|---|---|---|---|---|
| 3,816,708 A | * | 6/1974 | Walton | 235/439 |
| 4,333,072 A | * | 6/1982 | Beigel | 235/449 |
| 4,654,658 A | * | 3/1987 | Walton | 340/10.4 |
| 4,673,932 A | | 6/1987 | Ekchian | |
| 4,685,099 A | * | 8/1987 | White et al. | 370/278 |
| 4,893,118 A | * | 1/1990 | Lewiner et al. | 235/382 |
| 5,434,396 A | | 7/1995 | Owen | |
| 5,467,082 A | * | 11/1995 | Sanderson | 340/10.34 |

FOREIGN PATENT DOCUMENTS

WO    WO 98/20363    1/1998

* cited by examiner

Primary Examiner—Nina Tong

(57) ABSTRACT

A synchronous demodulator (10) drives an output antenna (21) with a push-pull driver circuit (13). The push-pull driver circuit (13) includes two transistors connected in a push-pull configuration driving a center-tapped transformer (17). The transformer (17) couples the push-pull driver circuit (13) to an antenna (21). Received signals are demodulated in the output driver circuit (13).

6 Claims, 2 Drawing Sheets

SYNCHRONOUS DEMODULATOR

BACKGROUND OF THE INVENTION

The present invention relates, in general to radio frequency modulation techniques, and more particularly, to synchronous demodulation of radio frequency signals.

The recent rise-in popularity and use of contactless credit cards or smartcards emphasizes the importance of having effective and reliable operation of such smartcard systems. A typical smartcard system has a smartcard terminal or reader and a portable smartcard that is powered by the reader through magnetic fields coupled through an antenna on the reader and an antenna on the smartcard. The reader typically transmits a radio frequency signal that is received by the smartcard and is used to power electronics within the smartcard. The smartcard recovers a clock from the radio frequency signal and uses the clock to form a subcarrier used to modulate data onto the radio frequency signal. This modulated radio frequency signal is received by the reader. The reader demodulates the modulated radio frequency signal to extract the encoded data. In the past, various techniques have been used to demodulate the encoded data transmitted by the smartcard to the reader.

Typically, the reader transmits the RF carrier through an output antenna. Additionally, the reader has a carrier rejection tuned circuit attached to the antenna of the reader in order to receive the data modulated RF carrier. This arrangement requires critical and precise tuning because rejection of the power in the carrier inherently requires a high "Q" filter. This increases the cost of the reader system. Over time, the frequency adjustment drifts, thus, constant readjustment is required to ensure proper operation.

Additionally, the carrier rejection tuned circuit only passes one sideband of the double sidebands in the received RF signal. This results in a loss of at least 6 dB, thus, the amplitude of the RF signal recovered by the tuned circuit is very small, typically less than approximately 2.0 milli-volts. Consequently there is a small signal-to-noise ratio making it difficult to accurately recover the data from the modulated RF carrier.

Further, because the carrier rejection tuned circuit only recovers one sideband, it creates a phase modulation factor that makes it difficult to recover the phase of the received modulated RF signal, thus, making it difficult to recover data transmitted by the smartcard to the reader Accordingly, it is desirable to have a demodulation method that does not require a critical adjustment to tune to the RF carrier frequency, that does not create phase modulation, and that recovers a large signal from the transmitted signal from the card.

DETAILED DESCRIPTION OF THE DRAWINGS

Figure 1:
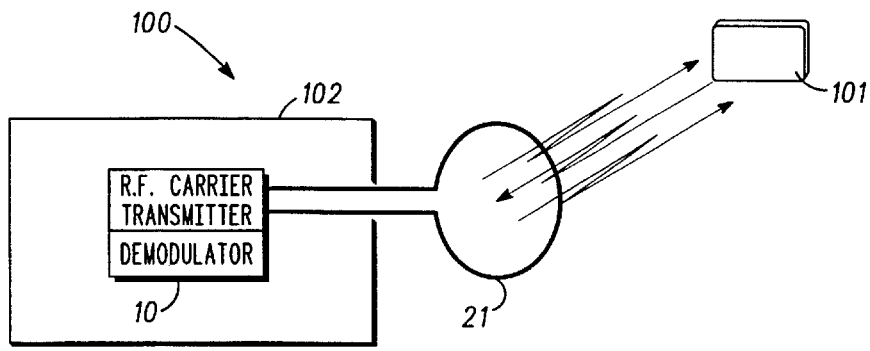
FIG. 1 schematically illustrates a smart card system in accordance with the present invention.

FIG. 1 schematically illustrates a smart card system 100 that synchronously demodulates a data signal that is part of a received modulated radio frequency (RF) signal. System 100 includes a smartcard terminal or reader 102 that communicates with a portable smartcard 101. Reader 102 includes an RF transmitter that drives an output antenna 21, and a synchronous demodulator 10 that receives the modulated RF signal from antenna 21.

Figure 2:
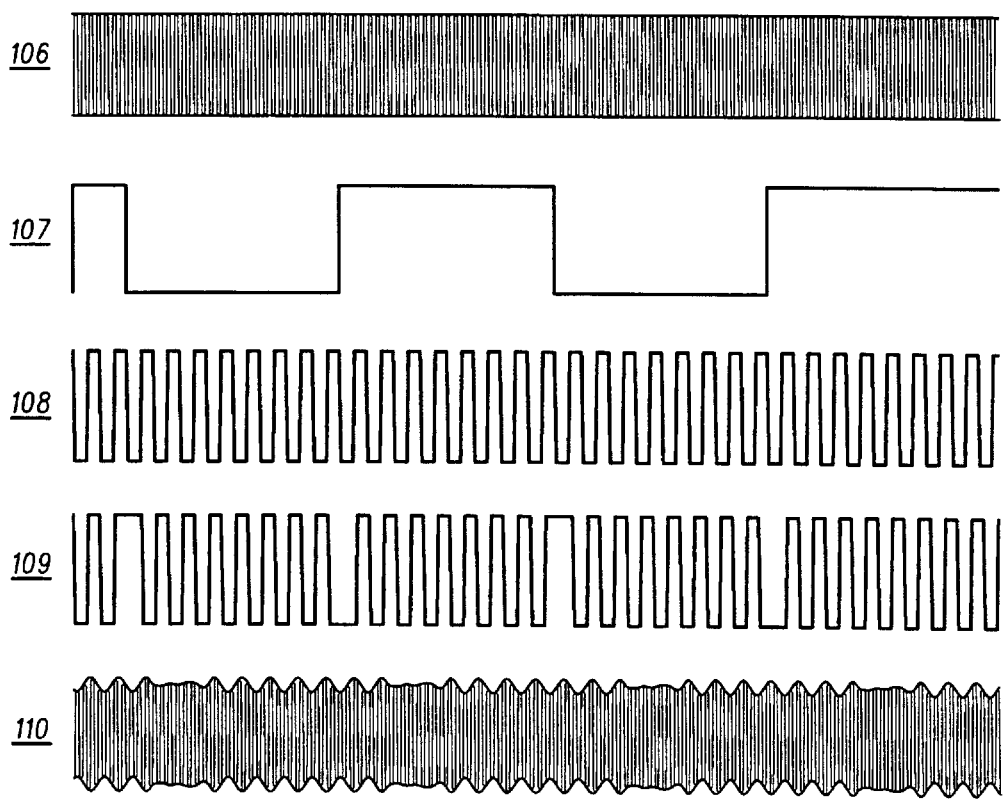
FIG. 2 schematically illustrates waveforms of the system of FIG. 1 in accordance with the present invention.

FIG. 2 schematically illustrates waveforms of the system of FIG. 1. Similar elements in FIG. 1 and FIG. 2 have the same element numbers. A waveform 106 represents the RF carrier transmitted by reader 102 to smartcard 101. A waveform 107 represents the baseband data signal generated by smartcard 101 and that is to be transmitted to reader 102. A waveform 108 represents the subcarrier signal that is developed by smartcard 101 after smartcard 101 receives the RF carrier signal of waveform 106, extracts a the clock from the signal shown by waveform 106, and divides the clock down to the subcarrier frequency. Typically, the RF carrier is about 13.56 MHz, and the subcarrier signal is about 847.5 kHz. A waveform 109 represents the modulated subcarrier formed by modulating the subcarrier illustrated in waveform 108 with the baseband data illustrated in waveform 107. A waveform 110 represents the modulated RF signal received by reader 102.

Figure 3:
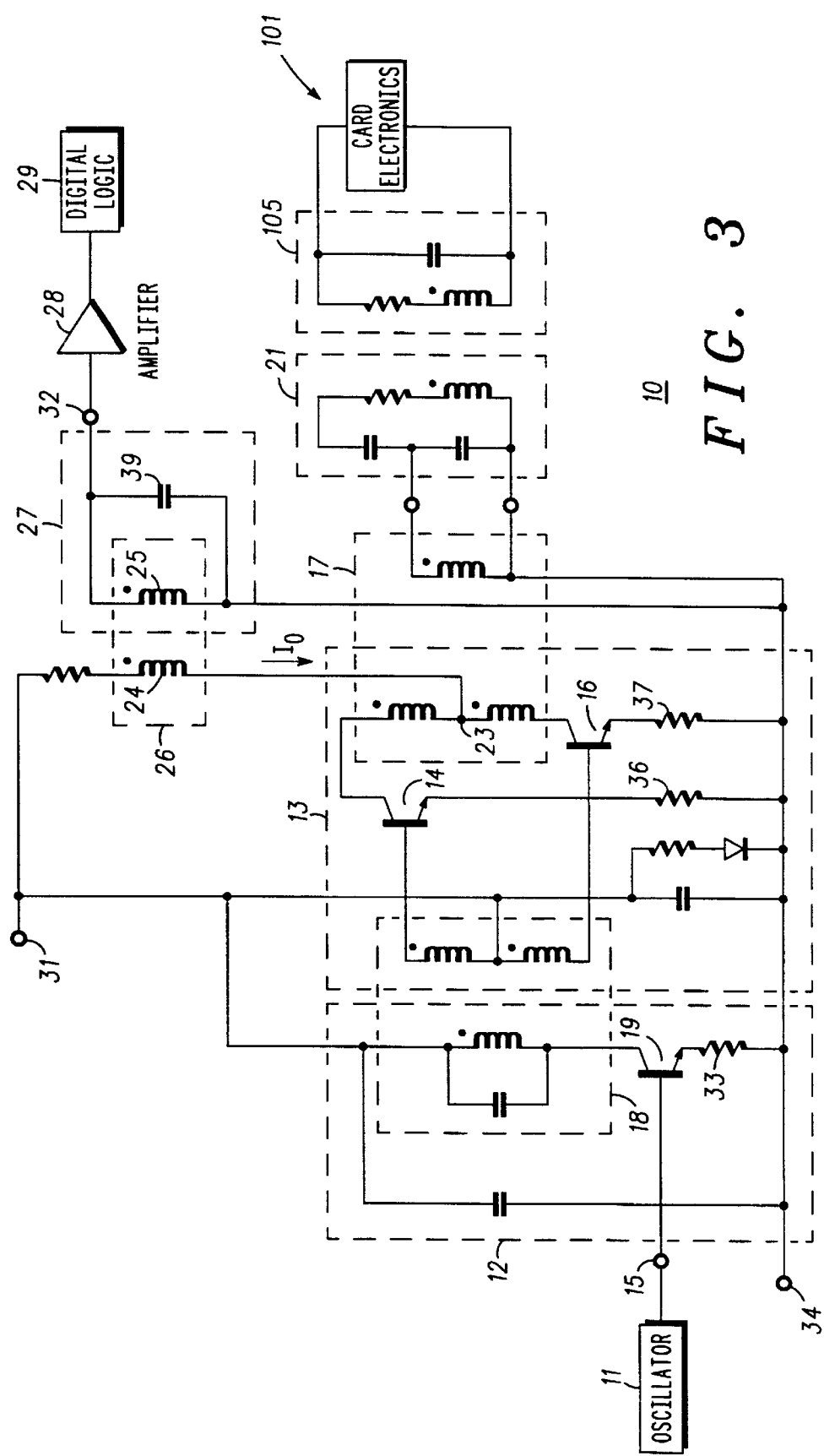
FIG. 3 schematically illustrates a synchronous demodulation circuit in accordance with the present invention.

FIG. 3 schematically illustrates synchronous demodulator 10 that receives the modulated RF signal formed by smartcard 101, along with other elements used to transmit the RF carrier to smartcard 101. Similar elements in FIGS. 1, 2, and 3 have the same element numbers. An oscillator 11 forms an RF frequency, for example 13.56 Mhz, that is used to develop the transmitted RF carrier. The RF frequency formed by oscillator 11 is applied to an amplifier input 15. An amplifier circuit 12 receives the RF frequency and couples it to an output driver circuit 13 in order to drive antenna 21 thereby transmitting power in the transmitted RF carrier to smartcard 101.

Amplifier circuit 12 has a amplifier driver transistor 19 with a base connected to input 15 for receiving the RF frequency an emitter coupled to a power return 34 through a resistor 33, and a collector coupled to one side of an amplifier coupling transformer 18 in order to switch transformer 18 at the RF frequency. Another terminal of transformer 18 is connected to a power supply terminal 31. Transformer 18 isolates amplifier circuit 12 and couples the RF frequency to output driver circuit 13.

Circuit 13 includes a push pull circuit and an output impedance matching transformer 17. The push pull circuit has a first push pull drive transistor 14 and a second push pull drive transistor 16 that are connected to opposite terminals of transformer 17. Transformer 17 matches the impedance of antenna 21 to transistors 14 and 16. Transistor 14 has a base connected to one terminal of transformer 18 in order to receive the RF frequency, an emitter coupled to return 34 through a resistor 36, and a collector connected to transformer 17 in order to drive one side of transformer 17 at the RF frequency. Transistor 16 has a base connected to another output of transformer 18, an emitter connected to return 34 through a resistor 37, and a collector connected to a second input of transformer 17 in order to drive transformer 17 at the RF frequency. A center terminal 23 functions as a power supply input of transformer 17 and is coupled to power supply terminal 31 through a series resistor 38 and an inductor 24 of a coupling transformer 26. A secondary winding of transformer 17 is connected to antenna 21 in order to drive antenna 21 with sufficient energy to power the electronics connected to an antenna 105 of card 101.

As the RF frequency from oscillator 11 is applied to transistors 14 and 16, a current $I_o$ flows through terminal 23 and inductor 24. When smartcard 101 is not modulating the RF carrier, current $I_o$ has a waveform and frequency that matches the waveform and frequency of the RF carrier illustrated by waveform 106 in FIG. 2.

After smartcard 101 receives the RF signal from antenna 21, smartcard 101 modulates the RF carrier with the data encoded subcarrier to form the modulated RF signal illustrated by waveform 106. This modulated RF signal is received by antenna 21 and is coupled back into the secondary winding, and thus, into the primary windings of transformer 17. Because transistors 14 and 16 are switching at the same frequency as the modulated RF signal that is coupled into the primary windings of transformer 17, the transmitted RF carrier is removed from the modulated RF signal thereby leaving the data modulated subcarrier signal supplied by smartcard 101. The both sidebands of the modulated RF are preserved and the energy contained therein is preserved thereby providing a larger amplitude signal, a higher signal-to-noise ratio, and preventing the introduction of phase modulation into the recovered data modulated subcarrier signal. This data modulated subcarrier signal modulates current $I_o$ at the same frequency and phase as the data modulated subcarrier formed by smartcard 101. Consequently, the primary centretap winding of transformer 17 and the switching of transistors 14 and 16 demodulate the RF carrier from the received modulated RF signal leaving only the data modulated subcarrier, thus, the 13.56 Mhz RF carrier has been removed leaving the 847.5 kHz data modulated subcarrier signal. As a result, current $I_o$ is also modulated by the data modulated subcarrier signal.

As current $I_o$ flows through inductor 24, the value and frequency of current $I_o$ is coupled into the secondary winding or inductor 25 of transformer 26. Inductor 25 and a capacitor 39 form a bandpass filter 27 that is tuned to the data modulated subcarrier signal, for example 847.5 kHz. Filter 27 typically has a "Q" of less than approximately 40 thereby allowing sufficient bandwidth for the one hundred eighty degree phase shifting that occurs in the data modulated subcarrier signal. Consequently, synchronous demodulator output 32 has an output signal that represents the data modulated subcarrier signal formed by smartcard 101. Typically, synchronous demodulator output 32 has a signal amplitude that is at least 500 milli-volts which assists in ensuring accurate recovery of the data.

Output 32 is coupled to an input of an amplifier 28 that is used to provide additional gain and shaping to provide a digital signal that is utilized by a digital logic block 29. Digital logic block 29 typically recovers the data from the modulated subcarrier signal. Such digital recover circuits are well known to those skilled in the art. Digital logic block 29 may also performs other digital logic functions on the signal received from smartcard 101.

It should be noted that demodulator 10 can also be used to demodulate a received signal that is created by using the data to turn the subcarrier on and off instead of using the data to phase shift modulate the carrier. Additionally, output driver circuit 13 can be have class B, C, or D amplifier as long as the output driver circuit has a coupling transformer, such as transformer 26, coupled in series with the power supply line to the output driver circuit in order to detect variations in the load current supplied to the output driver circuit. These variations in the load current are detected in the current coupled across the coupling transformer.

By now it should be appreciated that there has been provided a novel synchronous demodulation circuit and method. Demodulating the RF carrier from the modulated RF signal in the output transformer and output transistors assists in ensuring that no phase ambiguities are introduced in the received signal. Coupling a portion of the output current into a bandpass filter removes RF signals from the output current and couples received data signals through the input filter with the same phase and frequency that was used for transmitted the data signals. Consequently, the receiver data signals do not have phase variations and are easily recovered by digital logic. This synchronous demodulation technique significantly reduces the amount of circuitry required to recover the data signal from the received RF modulated carrier signal.

What is claimed is:

1. A synchronous demodulator comprising:

an output driver stage having a power supply input; and a coupling transformer having one inductor of the coupling transformer operably coupled in series between the power supply input and a power supply terminal of the synchronous demodulator for detecting variation in a load current of the output driver stage;

wherein the output driver stage includes;

a push-pull output driver having a first transistor and a second transistor;

a center-tapped transformer wherein the first transistor drives one terminal of a center-tapped winding, and the second transistor drives a second terminal of the center-tapped winding;

a first inductor coupled in series with the power supply input; and a second inductor operably coupled to develop a voltage selectively in response to current flow through the fast inductor corresponding to a sub-carrier of a received signal derived by modulating the signal of said output driver stage with said sub-carrier.

2. The synchronous demodulator of claim 1 further including a capacitor in parallel with the second inductor for forming a bandpass filter.

3. The synchronous demodulator of claim 2, further including an antenna coupled to the output driver stage.

4. The synchronous demodulator of claim 1, further including an antenna coupled to the output driver stage.

5. A synchronous demodulator comprising:

an output driver stage having a power supply input;

a coupling transformer having one inductor of the coupling transformer operably coupled in series between the power supply input and a power supply terminal of the synchronous demodulator for detecting variation in a load current of the output driver stage, and an antenna coupled to the output driver stage said variation in load current corresponding to a sub-carrier of a received signal derived by modulating the signal of said output driver stage with said sub-carrier.

6. The synchronous demodulator of claim 5 wherein the output driver stage comprises at least one of a class B, C and D amplifier.

* * * * *